US012563682B2

(12) United States Patent
Yu

(10) Patent No.: US 12,563,682 B2
(45) Date of Patent: Feb. 24, 2026

(54) POP-UP DISPLAY DEVICE AND VEHICLE INCLUDING THE SAME

(71) Applicant: HYUNDAI MOBIS CO., LTD., Seoul (KR)

(72) Inventor: Byung Mo Yu, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 146 days.

(21) Appl. No.: 18/439,446

(22) Filed: Feb. 12, 2024

(65) Prior Publication Data

US 2025/0063674 A1 Feb. 20, 2025

(30) Foreign Application Priority Data

Aug. 17, 2023 (KR) ........................ 10-2023-0107610

(51) Int. Cl.
*G06F 1/16* (2006.01)
*B60K 35/53* (2024.01)
*H05K 5/02* (2006.01)

(52) U.S. Cl.
CPC ........... *H05K 5/0217* (2013.01); *B60K 35/53* (2024.01); *B60K 2360/60* (2024.01)

(58) Field of Classification Search
CPC ...................... G06F 1/1601–1613; B60R 1/04
See application file for complete search history.

(56) References Cited

U.S. PATENT DOCUMENTS

| 2005/0034340 | A1* | 2/2005 | Burke | G09F 21/04 |
| | | | | 40/591 |
| 2006/0236329 | A1* | 10/2006 | Sugiura | G06F 1/1601 |
| | | | | 720/675 |
| 2008/0265113 | A1* | 10/2008 | Lin | F16M 11/18 |
| | | | | 345/60 |
| 2009/0008974 | A1* | 1/2009 | Hattori | B60R 11/0235 |
| | | | | 297/217.3 |
| 2009/0237821 | A1* | 9/2009 | Li | B60R 1/04 |
| | | | | 359/842 |
| 2013/0279015 | A1* | 10/2013 | Ishibashi | B60K 35/23 |
| | | | | 359/630 |
| 2015/0146359 | A1* | 5/2015 | Katsunuma | F16M 11/18 |
| | | | | 361/679.22 |
| 2023/0387748 | A1* | 11/2023 | Son | B60K 35/215 |
| 2024/0100952 | A1* | 3/2024 | Lee | B60K 35/53 |

* cited by examiner

*Primary Examiner* — Anthony Q Edwards
(74) *Attorney, Agent, or Firm* — NovoTechIP International PLLC

(57) ABSTRACT

A pop-up display device includes a housing, a display panel accommodated in the housing and movable in a vertical direction, a rear plate rotatably coupled to a back surface of the housing, and a gear unit disposed between a back surface of the display panel and the rear plate and configured to move the display panel. The gear unit is engaged with each other in a first state by rotation of the rear plate and is separated from each other in a second state by rotation of the rear plate. The pop-up display device can easily secure a front field-of-view (FOV) through a structure that allows manual operation of the pop-up display device mounted on the vehicle.

8 Claims, 11 Drawing Sheets

(b)

(a)

(b)

(a)

POP-UP DISPLAY DEVICE AND VEHICLE
INCLUDING THE SAME

CROSS-REFERENCE TO RELATED
APPLICATIONS

This application claims the benefit of Korean Patent Application No. 10-2023-0107610, filed on Aug. 17, 2023, which is hereby incorporated by reference as if fully set forth herein.

TECHNICAL FIELD

Embodiments of the present disclosure are applicable to vehicles of all fields, and more particularly to a pop-up display device capable of easily securing a front field-of-view (FOV) through a structure that allows the pop-up display device mounted on a vehicle to be manually operated, and a vehicle including the pop-up display device.

BACKGROUND

A center fascia display of a vehicle may display various visual information about the vehicle. Such a display device may also be installed on a dashboard of a vehicle disposed in front of a driver's seat and a front passenger seat, and provides various convenience information such as navigation, vehicle management and operation, Internet, and entertainment. In addition, the display device provides the above-described information, and includes a display panel for displaying images.

Recently, research on advanced driver assistance systems (ADAS) has been actively conducted to provide driving convenience for a user who drives a vehicle, and development of autonomous vehicles has also been actively conducted.

Accordingly, display devices mounted on vehicles are becoming larger in size to provide various kinds of information for a user (or a driver) of the vehicle. In order to adjust the degree of exposure of a display panel in response to the increasing size of the display device, the demand for pop-up display devices in which the display panel can move up and down has been increasing.

However, since the pop-up display device developed according to such enlargement of the display device may unexpectedly block the driver's front field-of-view (FOV), the pop-up display device may have difficulty in securing visibility of the driver (or the user).

Whereas securing visibility may not encounter a problem in an autonomous driving mode of the vehicle, such securing visibility is of importance to a normal driving mode in which the driver directly drives the vehicle. Therefore, when switching from the autonomous driving mode to the normal driving mode, there is a need to secure the front FOV of the driver by moving the pop-up display device downward. Otherwise, the risk of occurrence of a vehicle accident may increase.

The pop-up display device may move downward by driving electronic devices, but a plurality of electronic devices may be provided in the vehicle and malfunction of such electronic devices may occur in the vehicle. If the pop-up display device does not move downward due to such malfunction of the electronic devices, there is a risk of occurrence of a vehicle accident as described above.

In some cases, a sudden situation in which the driver must control the pop-up display device to move downward may unexpectedly occur in the vehicle.

Therefore, an improved structure for enabling the pop-up display device mounted on the vehicle to be manually operated is required to ensure the driver's front FOV.

SUMMARY

Accordingly, embodiments of the present disclosure are directed to a pop-up display device and a vehicle including the same that substantially obviate one or more problems due to limitations and disadvantages of the related art.

An object of the present disclosure is to provide a pop-up display device capable of easily securing a front field-of-view (FOV) through a structure that allows the pop-up display device mounted on a vehicle to be manually operated, and a vehicle including the pop-up display device.

Another object of the present disclosure is to provide a pop-up display device that can be manually operated such that a pop-up display panel moves downward when a device malfunction occurs, and can thus easily secure the front FOV, and a vehicle including the pop-up display device.

Technical tasks obtainable from the present disclosure are non-limited by the above-mentioned technical tasks, and other unmentioned technical tasks can be clearly understood from the following description by those having ordinary skill in the technical field to which the present disclosure pertains.

Additional advantages, objects, and features of the disclosure will be set forth in the disclosure herein as well as the accompanying drawings. Such aspects may also be appreciated by those skilled in the art based on the disclosure herein.

To achieve these objects and other advantages and in accordance with the purpose of the disclosure, as embodied and broadly described herein, a pop-up display device may include: a housing; a display panel accommodated in the housing and movable in a vertical direction; a rear plate rotatably coupled to a back surface of the housing; and a gear unit disposed between a back surface of the display panel and the rear plate. The gear unit is engaged with each other in a first state by rotation of the rear plate and is separated from each other in a second state by rotation of the rear plate.

The housing may include: a first stopper formed at a back surface of the housing, and configured to contact a front surface of the rear plate in the first state; and a second stopper formed to protrude from the back surface, and configured to contact a back surface of the rear plate in the second state.

The pop-up display device may further include: an elastic member coupled to the second stopper to apply clastic force to the back surface of the rear plate.

The gear unit comprises a rack gear, a bracket attached to the back surface of the display plane, and a pinion gear supported by the bracket, the pinion gear being configured to be positioned in engagement with the rack gear.

The rear plate may include: a lever formed to extend from an upper end of the rear plate; and a rotation protrusion formed at a lower end of the rear plate, wherein the rear plate rotates around the rotation protrusion.

The pop-up display device may further include: a back cover formed to cover the rear plate, wherein the back cover includes an opening formed such that the lever protrudes upward, and configured to guide a rotation area of the rear plate.

The lever may include: a cover member formed to cover the opening.

In accordance with another aspect of the present disclosure, a vehicle may include a vehicle body; a holder disposed in the vehicle body; and a pop-up display device mounted in the holder. The pop-up display device includes: a housing; a display panel accommodated in the housing and movable in a vertical direction; a rear plate rotatably coupled to a back surface of the housing; and a gear unit disposed between a back surface of the display panel and the rear plate, and configured to move the display panel. The gear units is engaged with each other in a first state by rotation of the rear plate and is separated from each other in a second state by rotation of the rear plate.

The housing may include: a first stopper formed at a back surface of the housing, and configured to contact a front surface of the rear plate in the first state; and a second stopper formed to protrude from the back surface, and configured to contact a back surface of the rear plate in the second state.

The vehicle may further include: an elastic member coupled to the second stopper to apply elastic force to the back surface of the rear plate.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Description will now be given in detail according to exemplary embodiments disclosed herein, with reference to the accompanying drawings. The same or equivalent components may be provided with the same reference numbers, and description thereof will not be repeated. As used herein, the suffixes "module" and "part" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

It will be understood that when an element is referred to as being "connected with" another clement, the element can be directly connected with the other element or intervening elements may also be present. In contrast, it will be understood that when an element is referred to as being "directly connected with" another element, there are no intervening elements present.

A singular representation may include a plural representation unless it represents a definitely different meaning from the context.

The terms such as "include" or "have" used herein are intended to indicate that features, numbers, steps, operations, elements, components, or combinations thereof used in the following description exist and it should be thus understood that the possibility of existence or addition of one or more different features, numbers, steps, operations, elements, components, or combinations thereof is not excluded.

Figure 1:
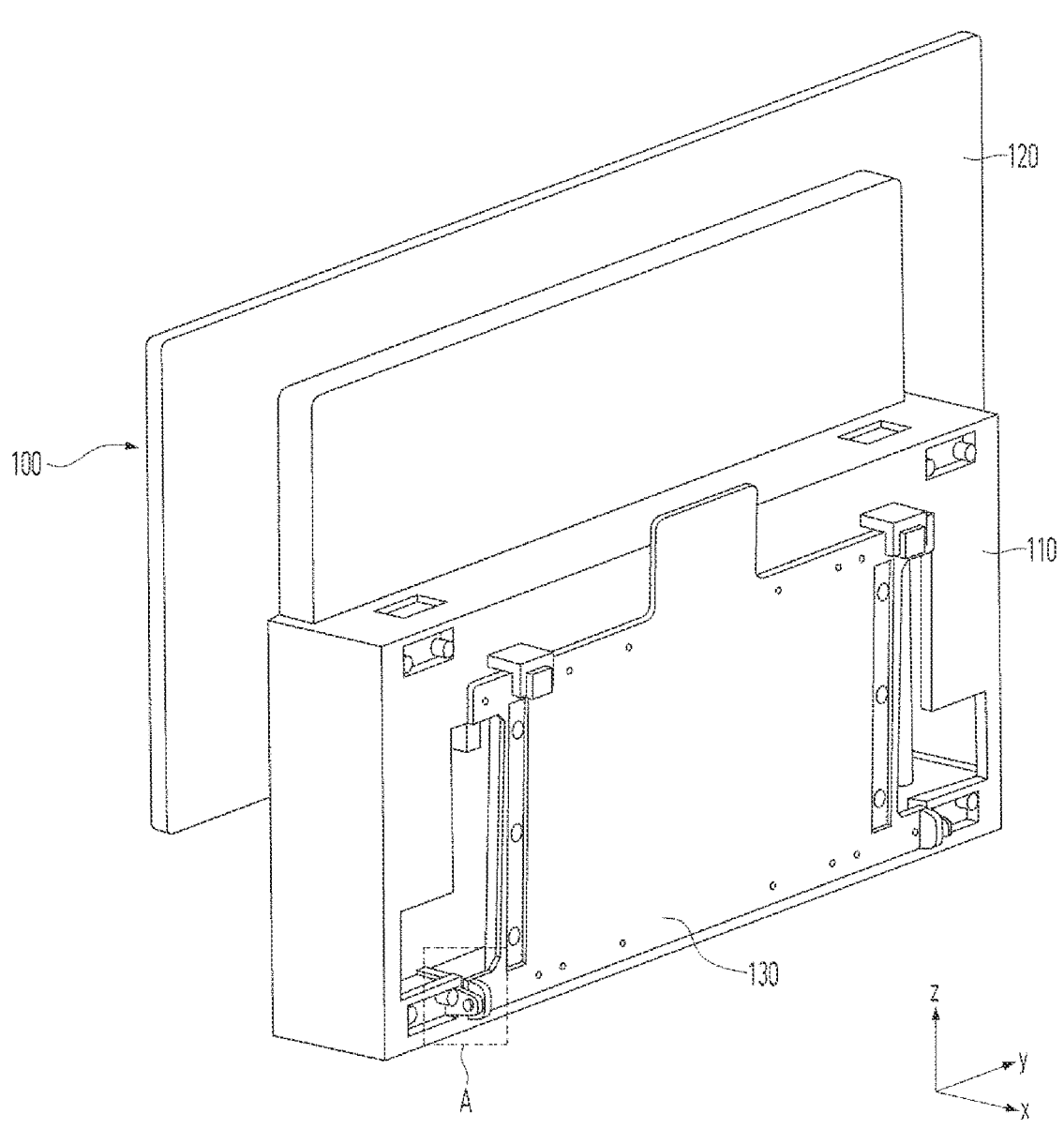
FIG. 1 is a perspective view illustrating a pop-up display device according to an embodiment of the present disclosure.
Figure 2:
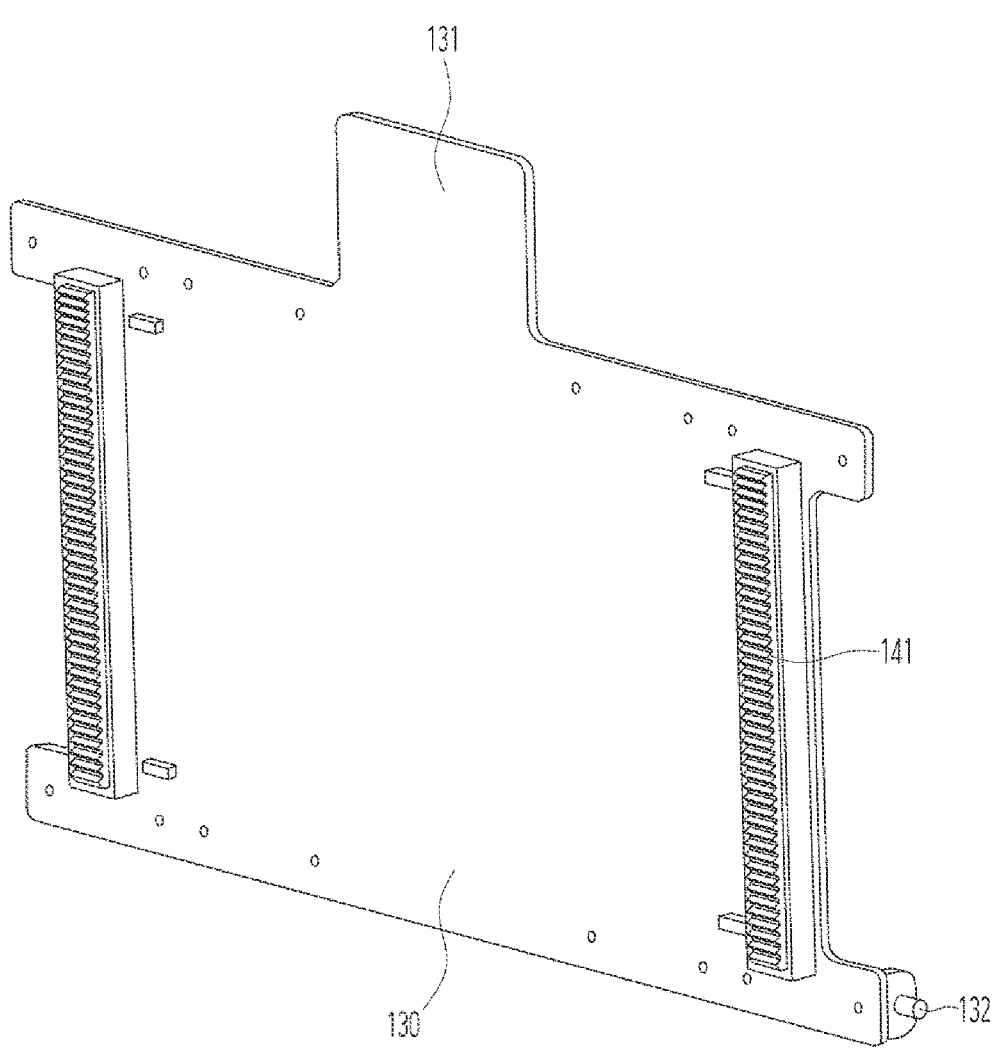
FIG. 2 is a view illustrating a rear plate for use in the pop-up display device according to an embodiment of the present disclosure.
Figure 3:
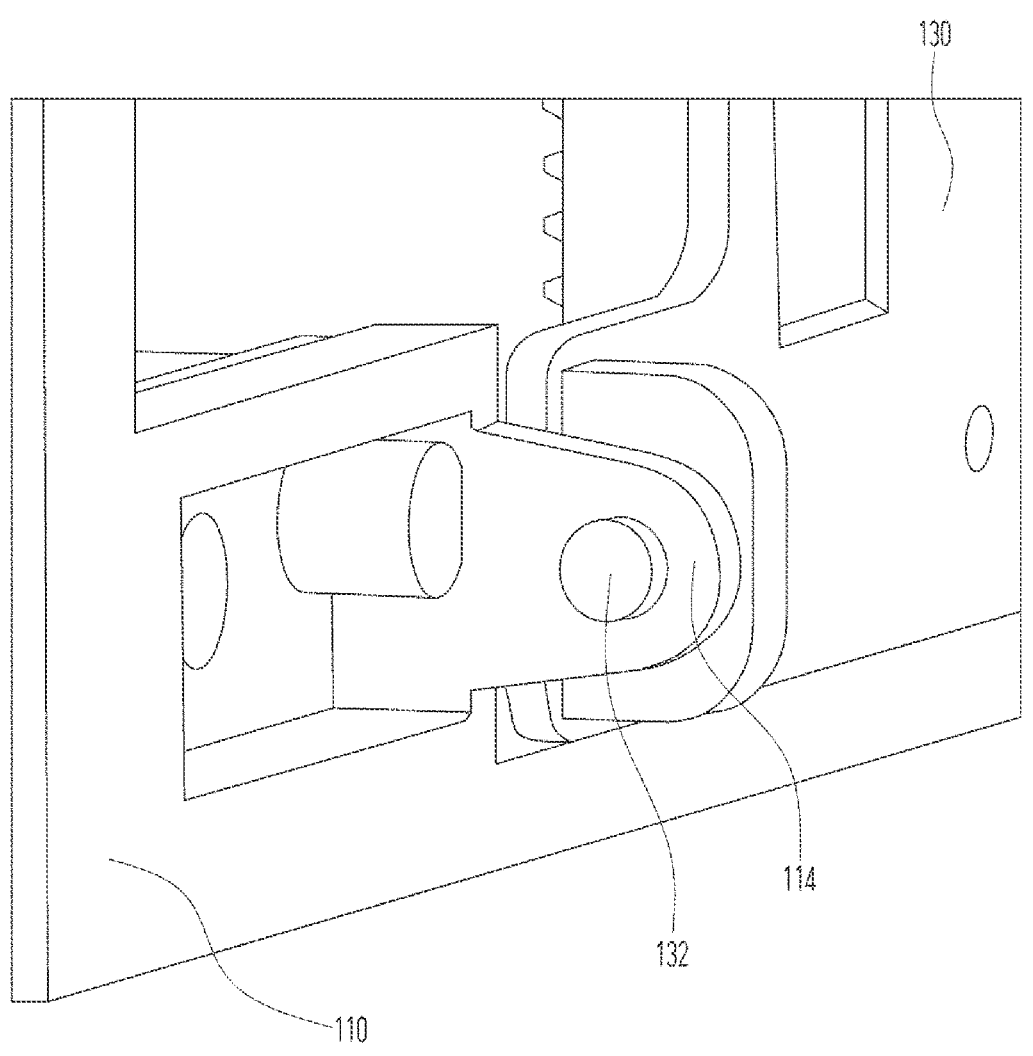
FIG. 3 is an enlarged view illustrating a region "A" depicted in FIG. 1 according to an embodiment of the present disclosure.
Figure 4:
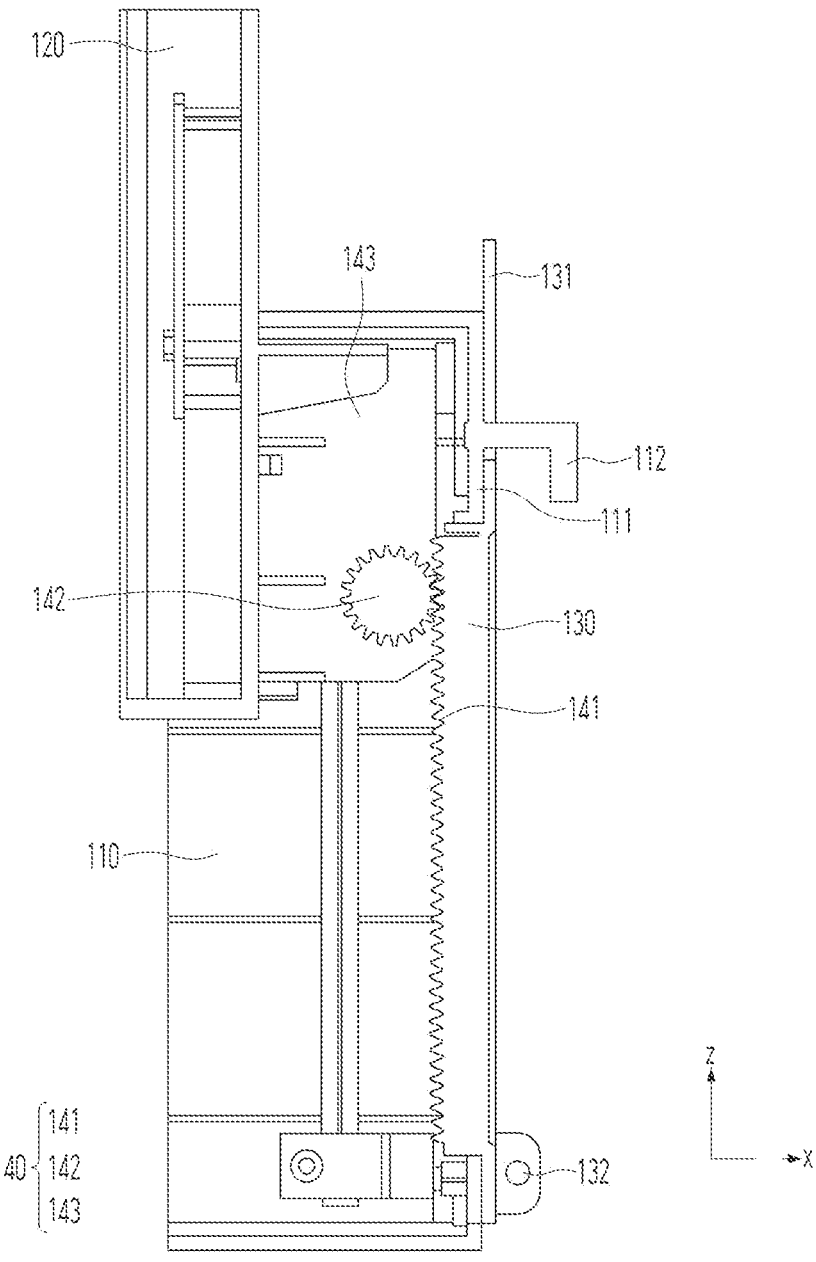
FIG. 4 is a side view illustrating a first state of the pop-up display device according to an embodiment of the present disclosure.
Figure 5:
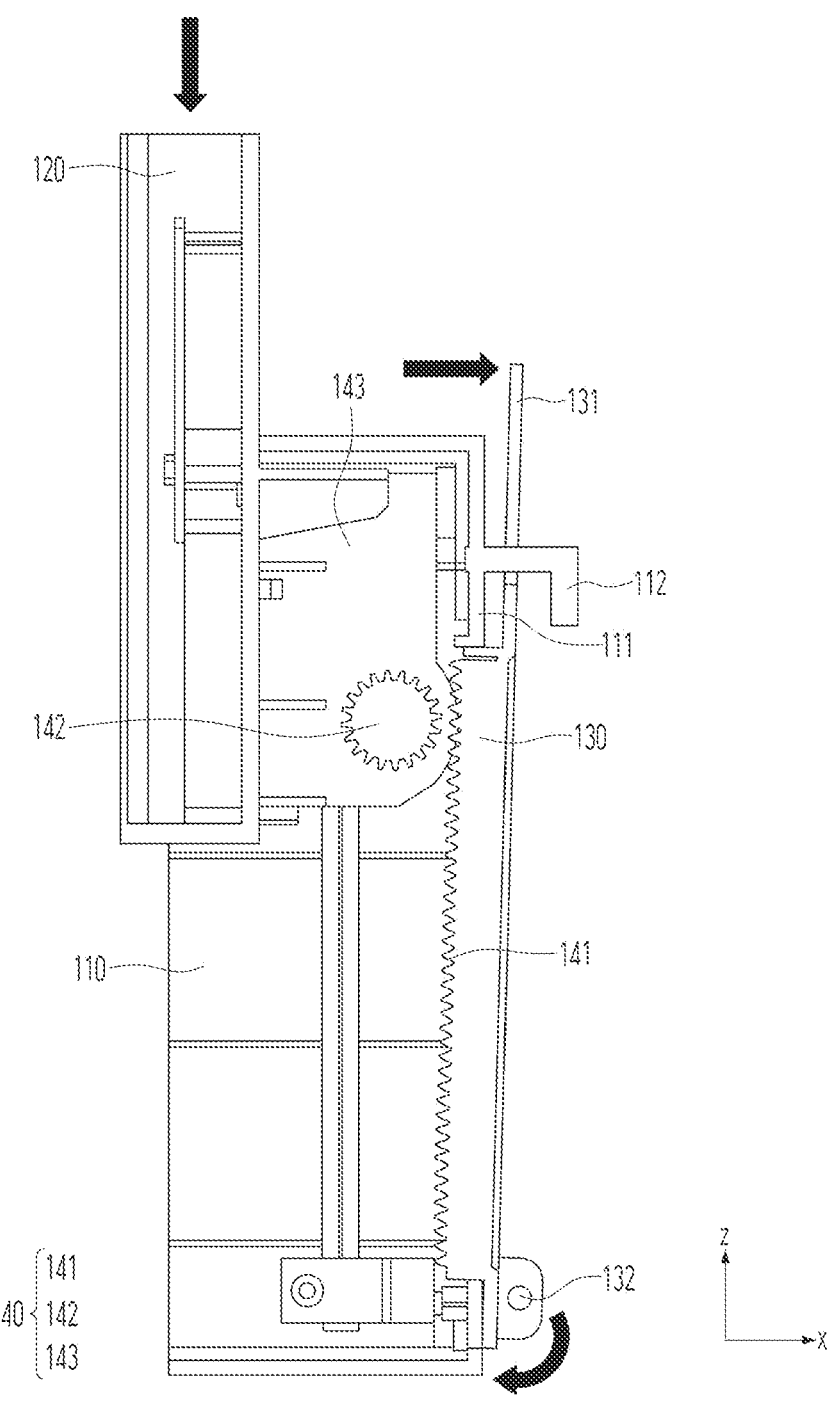
FIG. 5 is a side view illustrating a second state caused by rotation of a rear plate of the pop-up display device according to an embodiment of the present disclosure.

FIG. 1 is a perspective view illustrating a pop-up display device 100 according to an embodiment of the present disclosure. FIG. 2 is a view illustrating a rear plate 130 for use in the pop-up display device 100 according to an embodiment of the present disclosure. FIG. 3 is an enlarged view illustrating the region "A" depicted in FIG. 1 according to an embodiment of the present disclosure. FIG. 4 is a side view illustrating a first state of the pop-up display device 100 according to an embodiment of the present disclosure. FIG. 5 is a side view illustrating a second state caused by rotation of a rear plate 130 of the pop-up display device 100 according to an embodiment of the present disclosure.

Hereinafter, in describing various directions of the pop-up display device 100 according to an embodiment of the present disclosure, the forward and backward directions will hereinafter be described based on an X-axis direction, the left and right directions (i.e., a horizontal direction) will hereinafter be described based on a Y-axis direction, and the upward and downward directions (i.e., a vertical direction) will hereinafter be described based on a Z-axis direction.

The pop-up display device 100 according to an embodiment of the present disclosure may include a housing 110, a display panel 120, a rear plate 130, and a gear unit 140. Here, the display panel 120 may be accommodated in the housing 110, and may be movable in the vertical direction (Z-axis direction).

The rear plate 130 may be rotatably coupled to the back surface of the housing 110. Referring to FIG. 3, the rear plate 130 of the pop-up display device 100 may include a rotation protrusion 132 formed at a lower end thereof, and the housing 110 may include a coupling member 114 coupled to the rotation protrusion 132 at the back surface thereof. Accordingly, the rear plate 130 can rotate around the rotation protrusion 132.

In addition, referring to FIG. 2, the rear plate 130 of the pop-up display device 100 may include a lever 131 formed to extend from an upper end thereof. Accordingly, the driver who drives the vehicle can rotate the rear plate 130 by manually pushing or pulling the lever 131.

The gear unit 140 may be located between the back surface of the display panel 120 and the rear plate 130, and may serve to move the display panel 120 in the vertical direction (Z-axis direction). Referring to FIG. 4, the gear unit 140 of the pop-up display device 100 may include a rack gear 141, a pinion gear 142 engaged with the rack gear 141, and a bracket 143 in which the pinion gear 142 is accommodated.

Here, the rack gear 141 may be provided on a front surface of the rear plate 130 as shown in FIGS. 2 and 4. The pinion gear 142 may be accommodated in the bracket 143 provided on the back surface of the display panel 120, and may be engaged with the rack gear 141. The bracket 143 may accommodate the pinion gear 142 to prevent the pinion gear 142 from being separated from the pop-up display device 100.

In particular, referring to FIGS. 4 and 5, the pop-up display device 100 may be configured such that the rear plate 130 can rotate. By rotation of the rear plate 130, the gear unit 140 may enter an engaged mode in a first state, and may enter a separation mode in a second state.

Therefore, the pop-up display device 100 may be configured such that the driver can rotate the rear plate 130 by manually pushing the lever 131, and may enable the gear units 140 to enter the second state in which the gear units 140 are separated from each other by rotation of the rear plate 130.

In the second state, as shown in FIG. 5, the rack gear 141 provided on the front surface of the rear plate 130 and the pinion gear 142 provided in the bracket 143 provided at the back surface of the display panel 120 may be separated from each other. Then, the pop-up display panel 120 may move downward by separating the gear units 140 from each other.

Therefore, the pop-up display device 100 may move the pop-up display panel 120 downward through a structure that allows manual operation by the driver, so that the pop-up display panel 120 can move downward even in a situation such as a device malfunction, the front FOV of the driver can be easily secured.

Figure 6:
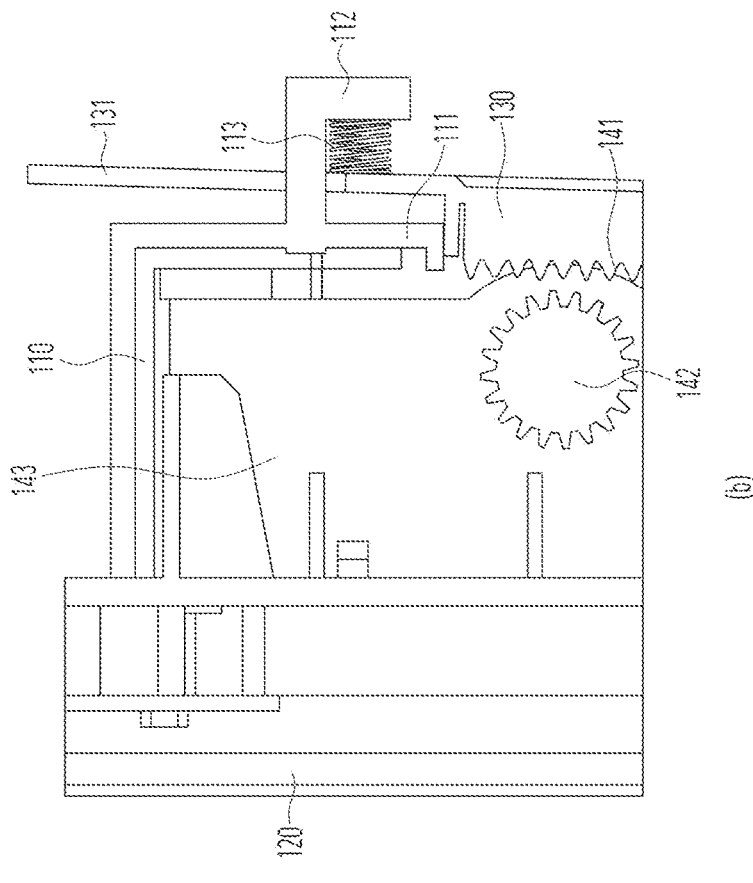
FIGS. 6 and 7 are views illustrating examples of an elastic member that applies elastic force to a back surface of the rear plate for use in the pop-up display device according to an embodiment of the present disclosure.
Figure 6:
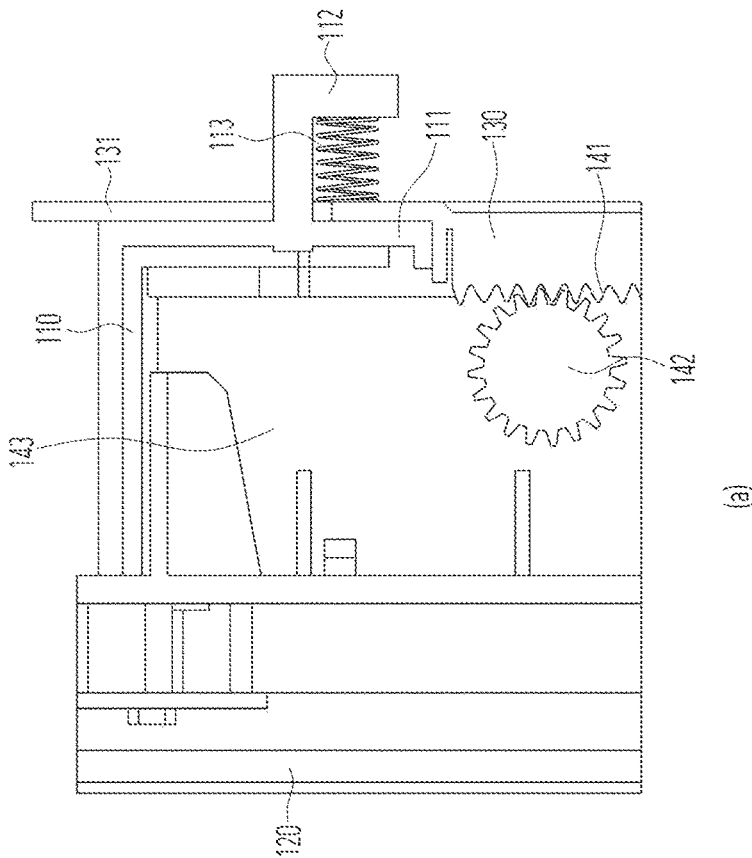
Figure 7:
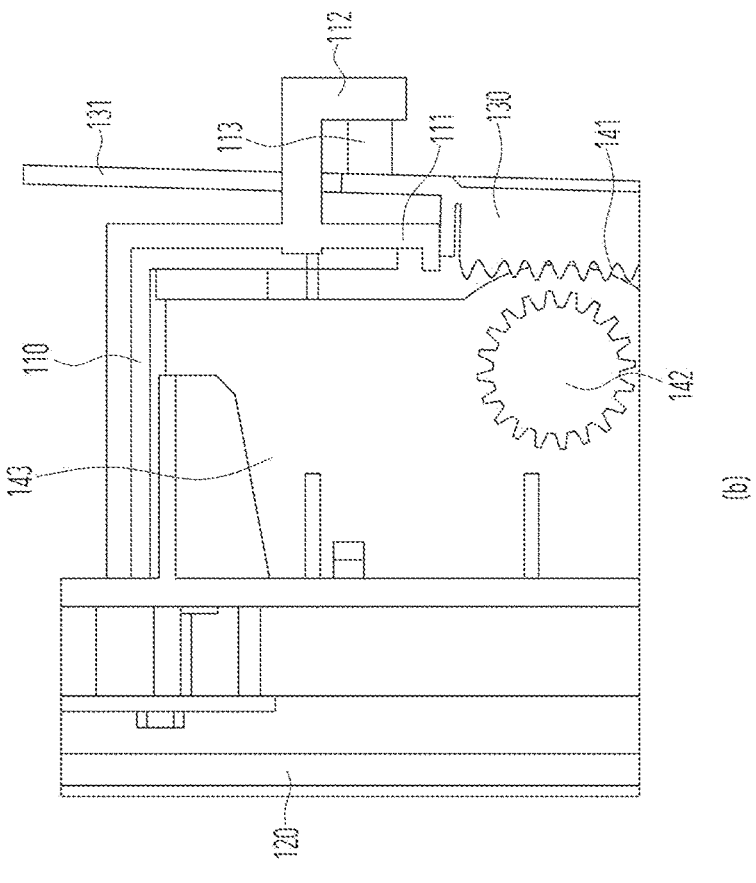
Figure 7:
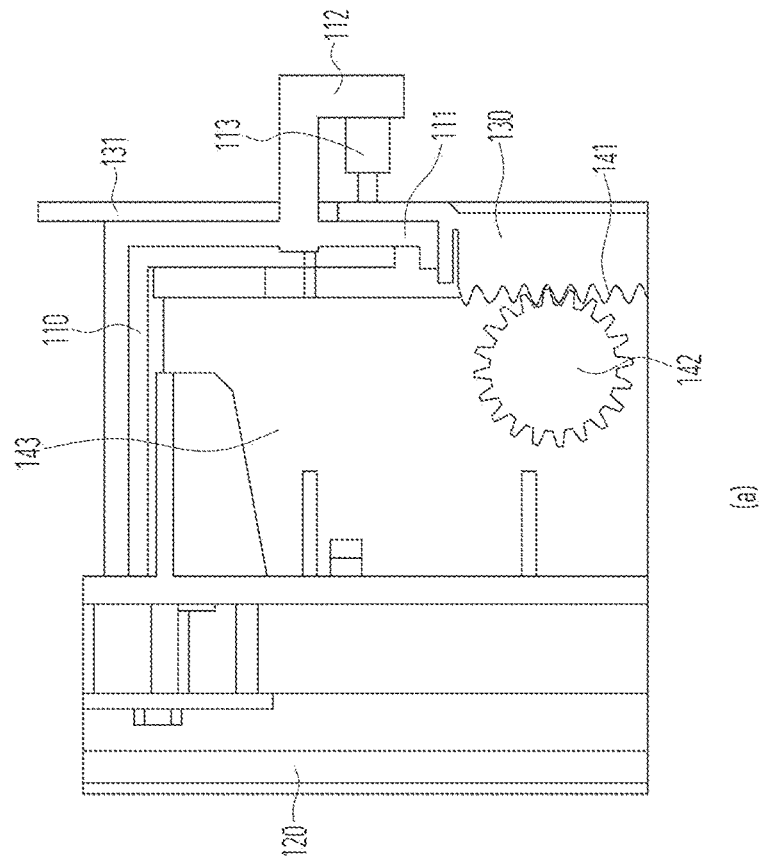

FIGS. 6 and 7 are views illustrating examples of an elastic member 113 that applies elastic force to the back surface of the rear plate 130 for use in the pop-up display device 100 according to an embodiment of the present disclosure.

Referring to FIGS. 4 and 5, the housing 110 of the pop-up display device 100 may include a first stopper 111 that is formed at the back surface of the pop-up display device 100 and is in contact with the front surface of the rear plate 130 in the first state.

In this case, the first stopper 111 may serve to restrict a movement area of the rear plate 130 to prevent the gear unit 140 from being damaged by excessive external force when the gear units 140 are engaged with each other.

In addition, the housing 110 of the pop-up display device 100 may include a second stopper 112 that is formed to protrude from the back surface of the pop-up display device 100 and is in contact with the back surface of the rear plate 130 in the second state.

The second stopper 112 may serve to restrict the movement area of the rear plate 130 when the driver pushes the lever 131 to rotate the rear plate 130.

In addition, the pop-up display device 100 may further include an elastic member 113 that is coupled to the second stopper 112 to apply elastic force to the back surface of the rear plate 130.

FIG. 6 shows a spring as an example of the elastic member 113, and FIG. 7 shows a solenoid-type actuator as another example of the elastic member 113.

As can be seen from FIG. 6(a) and FIG. 7(a), in the first state, the elastic member 113 may serve to push the rear plate 130 in a forward direction (i.e., X-axis direction) so that the rack gear 141 and the pinion gear 142 are engaged with each other.

Here, the elastic member 113 may have elastic force equal to or greater than force required to maintain the amount of engagement between the rack gear 141 and the pinion gear 142. In addition, as described above, the first stopper 111 formed at the back surface of the housing 110 may prevent the rack gear 141 and the pinion gear 142 from being damaged by excessive external force.

As shown in FIG. 6(b) and FIG. 7(b), in the second state, the elastic member 113 can apply elastic force to the back surface of the rear plate 130. Through this, after the driver pushes the lever 131 to rotate the rear plate 130, the rear plate 130 may return to the first state so that the rack gear 141 and the pinion gear 142 can be engaged with each other.

Figure 8:
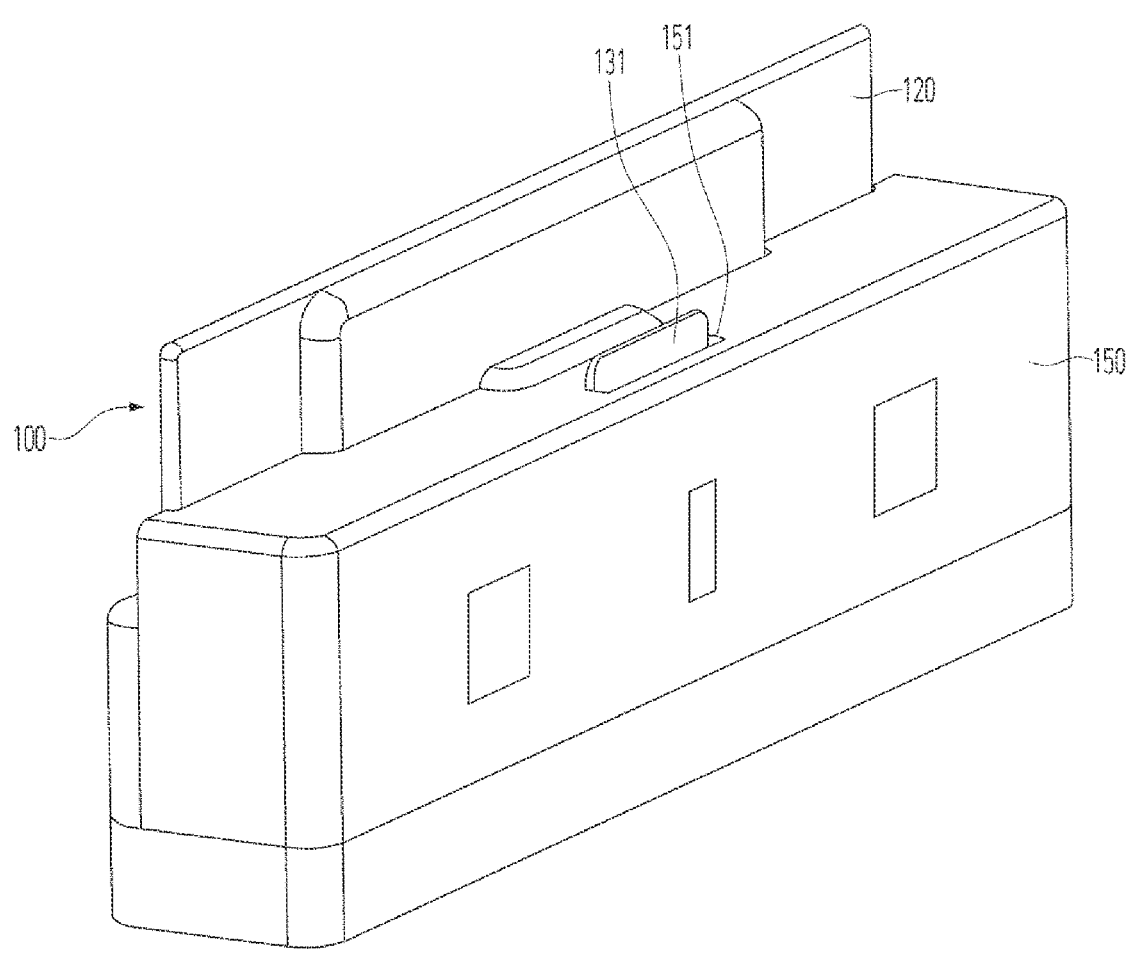
FIG. 8 is a view illustrating an exterior appearance of the pop-up display device configured to further include a back cover according to an embodiment of the present disclosure.
Figure 9:
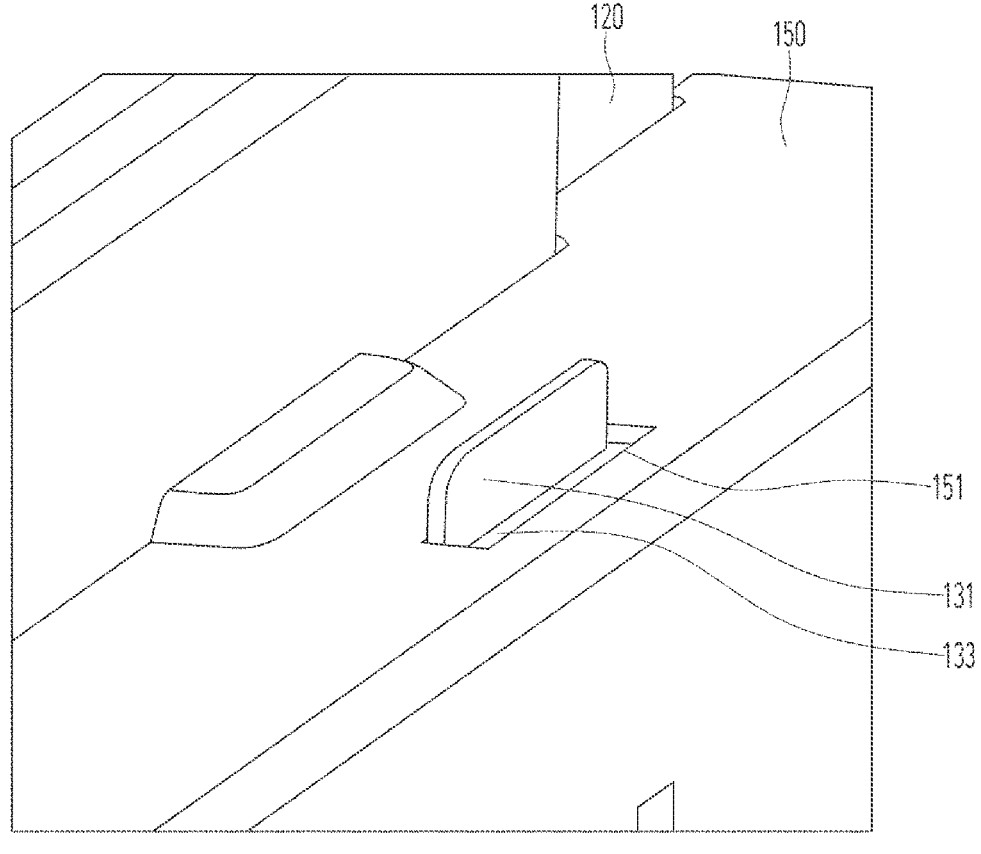
FIG. 9 is an enlarged view illustrating an upper portion of the back cover for use in the pop-up display device according to an embodiment of the present disclosure.
Figure 10:
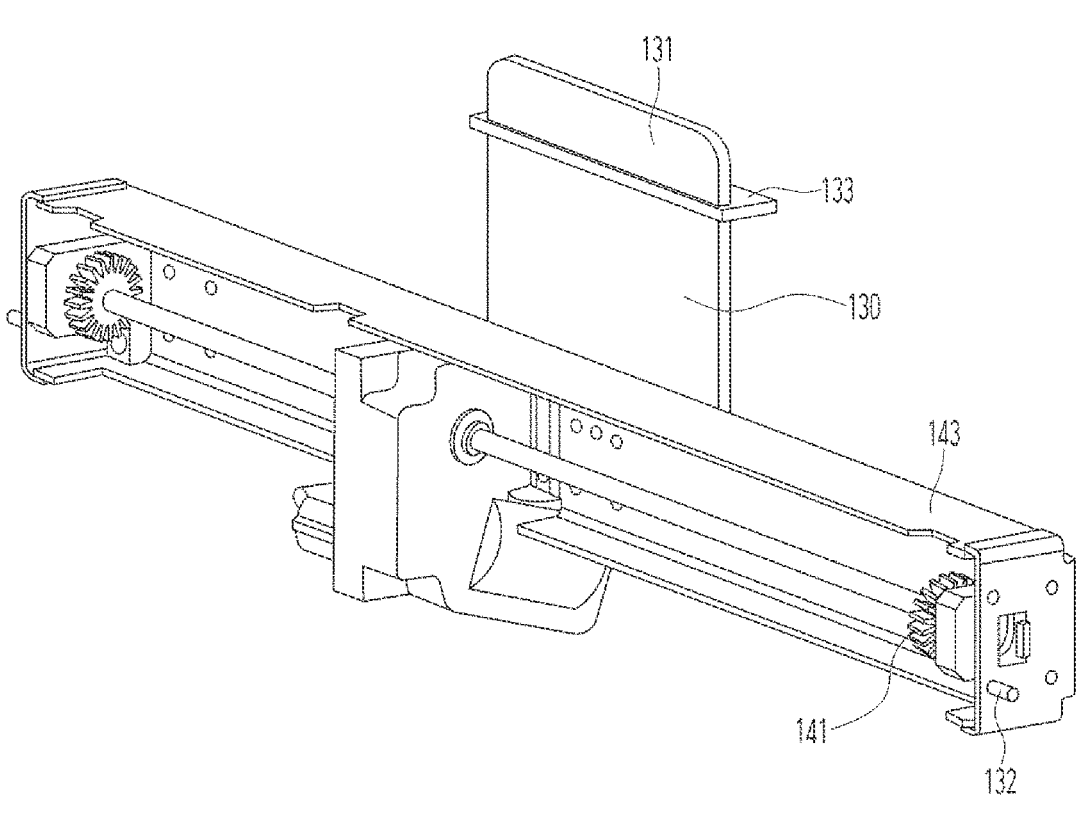
FIGS. 10 and 11 are views illustrating a rear plate and a gear unit for use in the pop-up display device according to another embodiment of the present disclosure.
Figure 11:
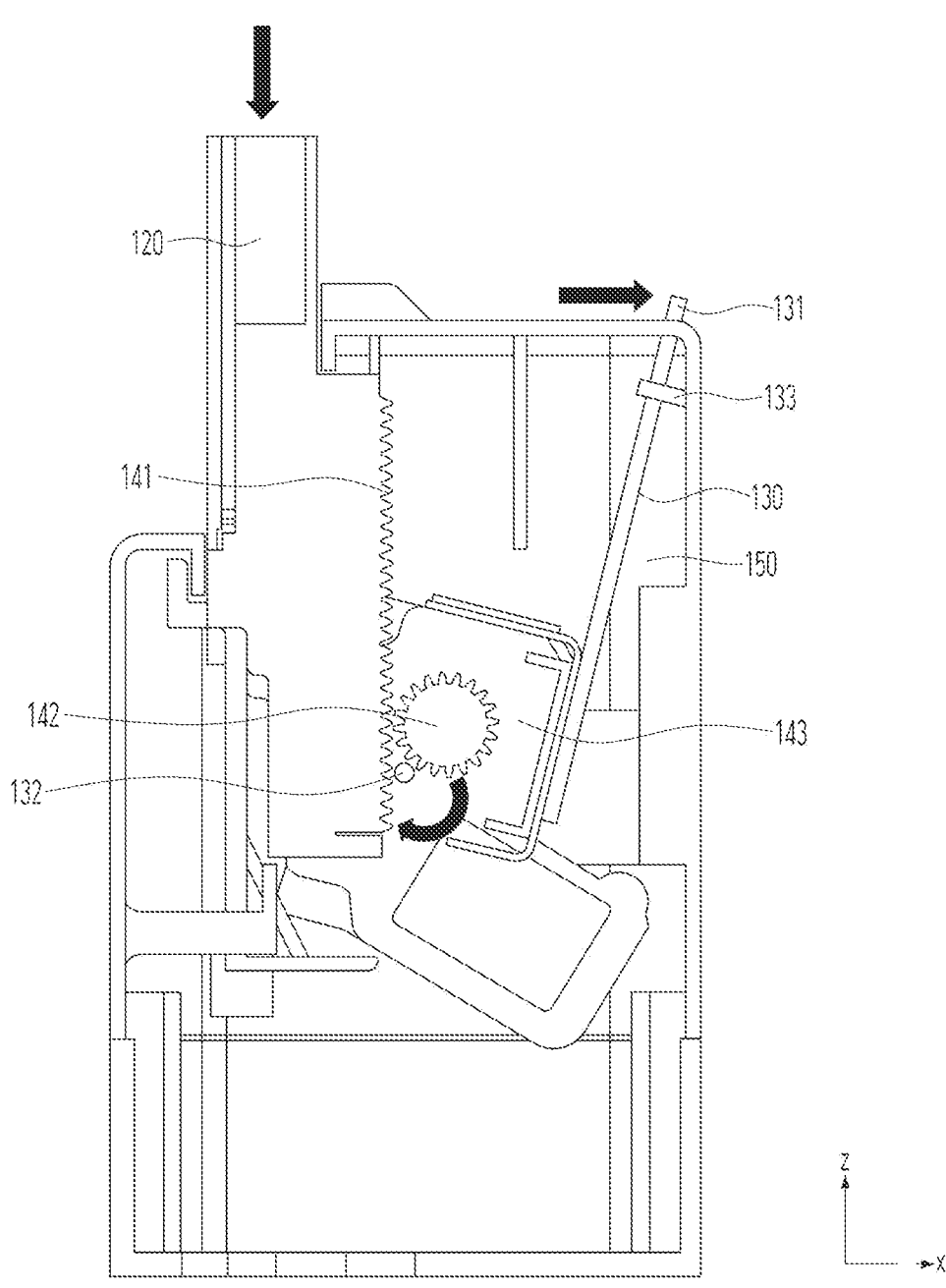

FIG. 8 is a view illustrating an exterior appearance of the pop-up display device 100 configured to further include a back cover according to an embodiment of the present disclosure. FIG. 9 is an enlarged view illustrating an upper portion of the back cover 150 for use in the pop-up display device 100 according to an embodiment of the present disclosure. FIGS. 10 and 11 are views illustrating the rear plate 130 and the gear unit 140 for use in the pop-up display device 100 according to another embodiment of the present disclosure.

Referring to FIG. 1, the pop-up display device 100 may further include a back cover 150 formed to cover the rear plate 130. Here, the back cover 150 may cover not only the rear plate 130 but also the housing 110 in which the display panel 120 is accommodated.

In addition, the back cover 150 may include the lever 131 formed to protrude upward at an upper portion thereof, and may include an opening 151 formed to guide the rotation area of the rear plate 130. The lever 131 may include a cover member 133 formed to cover the opening 151.

Here, the cover member 133 may serve to prevent foreign substances caused by gaps in the opening 151 from entering the pop-up display device 100. In addition, the cover member 133 may include a waterproof material, and may serve to prevent moisture from flowing into the pop-up display device 100.

In addition, referring to FIGS. 10 and 11, the pop-up display device 100 may include the rack gear 141 provided at the back surface of the display panel 120, unlike that shown in FIGS. 2 to 7, and the pinion gear 142 may be accommodated in the bracket 143 provided separately on the front surface of the rear plate 130 such that the pinion gear 1424 can be engaged with the rack gear 141.

In this case, the rotation protrusion 132 may be formed at the lower end of the rear plate 130 to serve as a rotary shaft, and as shown in FIG. 10, the rotation protrusion 132 may be formed at the lower end of the bracket 143 to serve as a rotary shaft when the rear plate 130 rotates.

Even when the rack gear 141 is provided at the back surface of the display panel 120 and the pinion gear 142 is accommodated in the bracket 143 provided at the front surface of the rear plate 130, the rack gear 141 and the pinion gear 142 may be engaged with each other in the first state described above, and the rack gear 141 and the pinion gear 142 may be separated from each other in the second state.

That is, as shown in FIG. 11, the driver may manually push the lever 131 to rotate the rear plate 130, and the rack gear 141 and the pinion gear 142 may be separated from each other by rotation of the rear plate 130. Then, the pop-up display panel 120 may move downward through separation between the rack gear 141 and the pinion gear 142.

Summarizing the above, the pop-up display device and the vehicle including the same according to the embodiments of the present disclosure can easily secure the front FOV through a structure that allows manual operation of the pop-up display device mounted on the vehicle. In addition, the pop-up display device can be manually operated such that the pop-up display panel moves downward when a device malfunction occurs, thereby easily securing the front FOV.

As is apparent from the above description, the pop-up display device and the vehicle including the same according to the embodiments of the present disclosure can easily secure the front FOV through a structure that allows the pop-up display device mounted on the vehicle to be manually operated.

The pop-up display device and the vehicle including the same according to the embodiments of the present disclosure can be manually operated such that a pop-up display panel moves downward when a device malfunction occurs, thereby easily securing the front FOV.

The above detailed description is to be construed in all aspects as illustrative and not restrictive. The scope of the present disclosure should be determined by reasonable interpretation of the appended claims and all changes coming within the equivalency range of the present disclosure are intended to be embraced in the scope of the present disclosure.

What is claimed is:

1. A pop-up display device comprising:
a housing;
a display panel accommodated in the housing and movable in a vertical direction with respect to the housing;
a rear plate rotatably coupled to a back surface of the housing; and
a gear unit including a plurality of gears disposed between a back surface of the display panel and the rear plate,
wherein:
the plurality of gears are engaged with each other in a first state by rotation of the rear plate and are separated from each other in a second state by rotation of the rear plate,
wherein the housing includes:
a first stopper formed at the back surface of the housing, the first stopper being configured to contact a front surface of the rear plate when the rear plate is in the first state; and
a second stopper that protrudes from the back surface and is configured to contact a back surface of the rear plate when the rear plate is in the second state.

2. The pop-up display device according to claim 1, further comprising:

an elastic member on the second stopper that is configured to apply elastic force to the back surface of the rear plate.

3. The pop-up display device according to claim 1, wherein:
the gear unit comprises;
a rack gear;
a bracket attached to the back surface of the display panel, and
a pinion gear supported by the bracket, the pinion gear being configured to be positioned in engagement with the rack gear.

4. A pop-up display device comprising:
a housing;
a display panel accommodated in the housing and movable in a vertical direction with respect to the housing;
a rear plate rotatably coupled to a back surface of the housing; and
a gear unit including a plurality of gears disposed between a back surface of the display panel and the rear plate,
wherein:
the plurality of gears are engaged with each other in a first state by rotation of the rear plate and is separated from each other in a second state by rotation of the rear plate, wherein the rear plate includes:
a lever that extends from an upper end of the rear plate; and
a rotation protrusion on a lower end of the rear plate via which the rear plate is rotatably coupled to the back surface of the housing.

5. The pop-up display device according to claim 4, further comprising:
a back cover that covers the rear plate, the back cover including an opening through which the lever extends, the lever and the opening cooperating to guide movement of the rear plate between the first state and the second state.

6. The pop-up display device according to claim 5, wherein the lever includes a cover member that covers the opening.

7. A vehicle comprising:
a vehicle body; and
a pop-up display device mounted to the vehicle body,
wherein the pop-up display device includes:
a housing,
a display panel accommodated in the housing and movable in a vertical direction with respect to the housing,
a rear plate rotatably coupled to a back surface of the housing, and
a gear unit including a plurality of gears disposed between a back surface of the display panel and the rear plate, and configured to move the display panel, and
wherein:
the plurality of gears are engaged with each other in a first state by rotation of the rear plate and are separated from each other in a second state by rotation of the rear plate,
wherein the housing includes:
a first stopper formed at a back surface of the housing that is configured to contact a front surface of the rear plate when the rear plate is in the first state; and
a second stopper that protrudes from the back surface and is configured to contact a back surface of the rear plate when the rear plate is in the second state.

8. The vehicle according to claim 7, further comprising:

an elastic member on the second stopper, the elastic member being configured to apply elastic force to the back surface of the rear plate.

* * * * *